United States Patent [19]

Tachikawa et al.

[11] 4,419,145
[45] Dec. 6, 1983

[54] PROCESS FOR PRODUCING NB₃SN SUPERCONDUCTOR

[75] Inventors: Kyoji Tachikawa, Tokyo; Hisashi Sekine; Kikuo Itoh, both of Sakura; Yasuo Iijima, Tsukuba, all of Japan

[73] Assignee: National Research Institute for Metals, Tokyo, Japan

[21] Appl. No.: 402,581

[22] Filed: Jul. 28, 1982

[51] Int. Cl.³ .................................. H01L 39/00
[52] U.S. Cl. .................... 148/11.5 F; 148/11.5 Q; 148/133
[58] Field of Search .......... 148/11.5 R, 11.5 F, 148/11.5 Y, 133; 29/599

[56] References Cited

U.S. PATENT DOCUMENTS

| 4,323,402 | 4/1982 | Tachikawa et al. | 148/133 |
| 4,341,572 | 7/1982 | Tachikawa et al. | 148/133 |
| 4,343,867 | 8/1982 | Luhman et al. | 428/930 |

FOREIGN PATENT DOCUMENTS 902802  6/1972  Canada ............................ 29/599

OTHER PUBLICATIONS

Flükiger et al., "Fabrication on a Laboratory Scale and Mechanical Properties of Cu-Nb-Sn Multifilamentary Superconducting Composite Wires Produced by Cold Powder Metallurgy Processing", Appl. Phys. Lett, 35(10), Nov. 15, 1979, pp. 810-812.

Tachikawa, "Developments of A15 Filamentary Composite Superconductors in Japan", *Filamentary A15 Superconductors*, Edited by Suenaga et al., Plenum Press, N.Y., 1980, pp. 1-15.

*Primary Examiner*—Peter K. Skiff
*Attorney, Agent, or Firm*—Fitzpatrick, Cella, Harper & Scinto

[57] ABSTRACT

In a process for producing at least one Nb₃Sn superconductor which comprises drawing a composite composed of a core of niobium or a niobium alloy and a matrix of a copper-tin alloy and subjecting the drawn composite to reactive heat-treatment, thereby forming a layer of Nb₃Sn between the core and the matrix; the improvement wherein the copper-tin alloy contains 1 to 15 atomic percent of tin, and 0.1 to 8 atomic percent in total of at least one element selected from 0.1 to 8 atomic percent of titanium, 0.1 to 5 atomic percent of zirconium and 0.1 to 5 atomic percent of hafnium.

8 Claims, No Drawings

PROCESS FOR PRODUCING NB₃SN SUPERCONDUCTOR

This invention relates to a process for producing a Nb₃Sn superconductor having improved properties.

Superconducting wires are used as coils in electromagnets for generating a strong magnetic field because they permit flowing of a large current without electric power consumption and their superconducting state can be retained even in a strong magnetic field. Nb-Ti type alloy wires are now used in the greatest quantities, but the magnetic field they can generate is about 85,000 gauss (8.5 Tesla; 8.5T) at the highest. For the generation of a stronger magnetic field, it is necessary to use a superconductor of a compound having a high upper critical magnetic field ($H_{c2}$). The superconductor of a compound, however, is difficult to fabricate into a long practical wire because of its hard and brittle nature.

In recent years, methods utilizing diffusion, such as surface diffusion and composite fabrication, were invented one after another making it possible to fabricate Nb₃Sn and V₃Ga compounds into wires, and have come into commercial acceptance. The surface diffusion is a method which, when applied to the production of a Nb₃Sn compound wire for example, comprises continuously passing a niobium (Nb) tape through a molten tin (Sn) bath to deposit Sn on the surface of the tape, and then heat-treating the tape at a suitable temperature to subject Nb and Sn to a diffusion reaction and thus to form a Nb₃Sn compound layer on the tape surface. The composite fabrication is a kind of solid diffusion method which, for example, comprises producing a composite composed of a core of Nb and a matrix of a Cu-Sn alloy as a solid solution, fabrication the composite into a desired shape, and then heat-treating the product to thereby react Nb selectively with Sn in the Cu-Sn alloy and to form a Nb₃Sn compound layer in the boundary surface between the core and the matrix. In the composite fabrication method, both the Nb core and the Cu-Sn alloy have sufficient plasticity, and can be easily fabricated into a desired shape such as a wire, tape or tube before it is submitted to heat-treatment. It is also possible to produce a wire having a multiplicity of ultrafine cores and being stable to rapid changes in magnetic field by embedding a plurality of Nb rods in a Cu-Sn alloy matrix, and fabricating the assembly into a fine wire by, for example, drawing. The ability to produce such an ultrafine multicore wire with high stability is the great characteristic feature of the composite fabrication method. Nb₃Sn or V₃Ga compound wires produced by the surface diffusion method and the composite fabrication method have already been utilized in small-sized strong magnetic field magnets for a study of physical properties.

On the other hand, research and development work has been under way recently on large-sized strong magnetic field magnets for use in nuclear fusion reactors, superconducting electric generators, high energy storage systems, etc., and there is an urgent need for ultrafine multicore compound wires having a high critical current ($I_c$) in a strong magnetic field above 12T and capable of maintaining a stable superconducting condition against rapid changes in magnetic field as a superconducting wire for use in these large-sized strong magnetic field magnets. The $I_c$ of a conventional Nb₃Sn compound wire produced from a composite of pure Nb and a Cu-Sn binary alloy rapidly decreases in a magnetic field above 12T, and it is difficult to produce a superconducting magnet capable of generating a magnetic field above 12T from this wire. On the other hand, a V₃Ga compound wire has better strong magnetic field properties than Nb₃Sn, but since the cost of materials for the compound is fairly expensive, it is not advantageous for use in large-sized facilities which require a large amount of the wire. Rather, it is better to use a Nb₃Sn wire obtained by the composite fabrication method, which has improved strong magnetic field properties as a result of adding a small amount of alloy elements.

Previously, the present inventors invented methods for producing Nb₃Sn compound wires having markedly improved superconducting properties in a strong magnetic field, which comprises forming a composite from a core of a binary alloy obtained by dissolving Hf or Ti in Nb and a Cu-Sn binary alloy or a ternary Cu-base alloy obtained by adding Ga or Al to the Cu-Sn alloy, and then fabricating the composite by, for example, drawing (see U.S. Pat. No. 4,224,087 and U.S. Ser. No. 302,956). In these methods, the Nb core and the additive metal in the Cu-Sn alloy promote diffusion and formation of the Nb₃Sn compound and partly dissolve in the compound layer, thus serving to improve the superconducting properties of the resulting wires in a strong magnetic field. In the fabrication of an ultrafine multicore wire having very fine Nb cores, it is especially important that the Nb cores should have good workability. Since the workability of the Nb cores is reduced with increasing amount of Hf or Ti, the amount of Hf or Ti which can be added to the Nb cores is limited, and therefore, a limit exists to the improvement of superconducting properties.

It is an object of this invention to solve the aforesaid problem, and to provide a process for producing a Nb₃Sn superconductor which has strong magnetic field properties, and can be easily fabricated into an ultrafine multicore wire.

The present inventors made investigations in order to achieve the above object. These investigations have finally led to the discovery that the inclusion of Ti, Zr and/or Hf in a Cu-Sn matrix alloy gives improved strong magnetic field properties, and fabrication of the Nb₃Sn superconductor into an ultrafine multicore wire can be made easy by using a Cu-base alloy containing predetermined amounts of Sn and at least one of Ti, Zr and Hf in the production of a composite with Nb.

The present invention is directed to a process for producing a Nb₃Sn wire by a composite fabrication technique which comprises forming a composite composed of at least one core of Nb and a matrix of a Cu-base alloy, fabricating the composite into a long wire by rolling, wire drawing, tube drawing, etc., and then heat-treating the wire to thereby form a Nb₃Sn superconducting compound in the boundary between the core and the matrix in the composite, characterized in that the Cu-base alloy contains Sn and 0.1 to 8 atomic percent in total of at least one element selected from the group consisting of Ti, Zr, and Hf.

As the core, an Nb alloy consisting of Nb and 0.1 to 15 atomic percent of one element selected from Ti, Zr and Hf may be used instead of Nb. It is essential that the concentration of Sn in the Cu-base alloy be in the range of 1 to 15 atomic percent. If it is less than 1 atomic percent, the formation of Nb₃Sn is very slow during heat-treatment, and its superconducting properties are markedly degraded. If it is above 15 atomic percent, the workability of the Cu-base alloy is much reduced. The preferred range of the Sn concentration is 5 to 9 atomic percent.

At least one of Ti, Zr, and Hf is added to the Cu-base alloy. The amounts of these elements contained in the Cu-Sn alloy are 0.1 to 8 atomic percent for Ti, 0.1 to 5 atomic percent for Zr, and 0.1 to 5 atomic percent for Hf, and the total amount of these is 0.1 to 8 atomic percent. If the amounts of these elements are below the specified lower limits, no effect is obtained in the improvement of strong magnetic field properties. If, on the other hand, they exceeds the upper limits specified, the workability of the Cu-base alloy matrix is reduced, and the superconducting properties of the resulting $Nb_3Sn$ are degraded. The preferred total amount of Ti, Zr, and Hf is 0.2 to 2 atomic percent.

The Nb alloy used as the core instead of Nb contains any one of Ti, Zr and Hf in an amount of 0.1 to 15 atomic percent based on the Nb alloy. If the content of the additive element is less than 0.1 atomic percent, no effect is obtained in the improvement of strong magnetic field properties. If, on the other hand, it exceeds 15 atomic percent, the $I_c$ and critical temperature of the resulting product are decreased, and the workability of the Nb alloy core is reduced greatly. The preferred amount of the additive element is in the range of 0.5 to 5 atomic percent.

The heat-treatment of the composite wire for the formation of the $Nb_3Sn$ compound is carried out preferably at a temperature of 600° to 900° C. If the temperature is below 600° C., the rate of formation of the $Nb_3Sn$ compound is very slow and the resulting product has poor superconducting properties. If it exceeds 900° C., the Cu-base alloy is molten and the diameter of the resulting wire is non-uniform. Furthermore, at such higher temperatures, crystal grains of $Nb_3Sn$ become large and the product has degraded superconducting properties.

If desired, before the above-mentioned heat-treatment, the surface of the fabricated composite may be coated with Sn by electro-plating, melt-plating, vacuum deposition, etc. This permits Sn to be diffused in the Cu-base alloy matrix, and increases the concentration of Sn in the Cu-base alloy matrix. The suitable amount of Sn to be coated is 0.1 to 50 volume percent. If it is less than 0.1 volume percent, no effect is obtained in the improvement of superconducting properties. If it exceeds 50 volume percent, a compound layer other than $Nb_3Sn$ undesirably forms.

Before the reactive heat-treatment for formation of $Nb_3Sn$ after coating Sn, the coated wire may be preheated at a temperature of 100° to 650° C. in order to diffuse Sn in the Cu-Sn alloy.

After the reactive heat-treatment for the formation of $Nb_3Sn$, the heat-treated product is desirably subjected to aging heat-treatment in order to increase the mechanical strength of the Cu-base alloy. The suitable temperature for aging heat-treatment is in the range of 200° to 600° C. If it is below 200° C. or above 600° C., no effect is obtained in strengthening the Cu-base alloy.

During the heat-treatment for the formation of $Nb_3Sn$, Ti, Zr or Hf added to the Cu-base alloy dissolves in the $Nb_3Sn$ compound layer and improves the superconducting properties, especially $H_{c2}$, of the $Nb_3Sn$ compound. Furthermore, these additive elements serve to increase the rate of formation of the $Nb_3Sn$ compound, and thus further brings about the advantage that the $Nb_3Sn$ compound is formed in a thick layer, and a wire having a large current capacity can be easily produced from the resulting composite. By the effects of these additive elements, the $I_c$ of the wire obtained markedly increases in a strong magnetic field above 12T. This enables various machines and instruments utilizing superconducting properties to be used in a strong magnetic field with sufficient latitude, and increases the safety and reliability of these machines and instruments. Hence, the economical and technical advantages of increased $H_{c2}$ are very great.

The speed of diffusion of Ti, Zr or Hf in the Cu-base alloy is much higher than that in the Nb core and such an additive element is easily supplied to, and dissolved in, the $Nb_3Sn$ compound. Thus, improvement in superconducting properties can be achieved even if the amount of the additive metal is much smaller than in the case of adding the additive metal only to the Nb core.

In the production of an ultrafine multicore wire, the workability of the core material is very important in practice. The pure Nb core or the Nb alloy core containing a relatively small amount of Ti, Zr or Hf used in this invention has excellent workability, and is especially beneficial in practical application. For example, in the production of an ultrafine multicore wire using a core of Nb-10 atomic percent Hf alloy, breakage of the core material does not occur when the core diameter is 20 $\mu m$ or more. But when the core diameter decreases to 5 $\mu m$, the core material is broken here and there to cause a deterioration in superconducting properties. In contrast, when the pure Nb core or a core of Nb-2 atomic percent Hf alloy is used, no trouble occurs in wire drawing to a core diameter of 5 $\mu m$.

The addition of Ti, Zr or Hf to the Cu-base alloy matrix promotes diffusion of Sn and increases the rate of forming $Nb_3Sn$. Coating of the surface of the Cu-base alloy with Sn results in supplementing the Cu-Sn alloy with Sn to cope with consumption of Sn that occurs as $Nb_3Sn$ is formed. As a result, a wire having a much higher $I_c$ value can be produced. Furthermore, by performing aging heat-treatment after the reactive heat-treatment for the formation of $Nb_3Sn$, the $Nb_3Sn$ is aged and hardened by the action of Ti, Zr or Hf remaining in the Cu-base alloy, and the stress resistance of the Cu-base alloy matrix can be increased. The present invention is advantageous in this respect because with large-sized magnets such as those used in a nuclear fusion reactor, a strong electromagnetic stress will be exerted on a coil wire, and a wire having excellent stress resistance is required.

The following examples illustrate the present invention more specifically.

EXAMPLE 1

Four Cu-base alloys, i.e. Cu-7 atomic percent Sn-1 atomic percent Ti, Cu-7 atomic percent Sn-0.5 atomic percent Zr, Cu-7 atomic percent Sn-1 atomic percent Hf, and Cu-7 atomic percent Sn-1 atomic percent Ti-0.5 atomic percent Hf, were each produced by melting in a Tammann furnace using a graphite crucible. Each of these Cu-base alloys was formed into an alloy tube having an outside diameter of 7 mm and an inside diameter of 3.5 mm by swaging, mechanical working, etc. A round Nb rod was inserted into the alloy tube and the composite was fabricated into a round wire having an outside diameter of 0.5 mm by using grooved rolls and by wire drawing. The wire was then heat-treated in an argon gas atmosphere at 750° C. for 50 hours, and further subjected to aging heat-treatment at 350° C. for 10 hours for strengthening the Cu-base alloy matrix.

The $I_c$ and tensile strength of each wire were measured, and the results are shown in Table 1.

COMPARATIVE EXAMPLE 1

Instead of each of the Cu-base alloys used in Example 1, a Cu-base alloy composed of Cu and 7 atomic percent Sn was fabricated and heat-treated under the same conditions as in Example 1. The $I_c$ and tensile strength of the resulting wire were measured, and the results are shown in Table 1.

COMPARATIVE EXAMPLE 2

Example 1 was repeated except that a Cu-7 atomic percent Sn alloy was used, and a core of Nb containing 4 atomic percent of Ti was used. The properties of the resulting wire are shown in Table 1.

It is seen from the results shown in Table 1 that by the addition of Ti, Zr or Hf to a Cu-base alloy matrix, the $I_c$ in a strong magnetic field (15T) is improved, and the aging heat-treatment increases the tensile strength, i.e. stress resistance, of the wire. Furthermore, the wires obtained in Example 1 had higher $I_c$ values and tensile strength than the wire of the same size shown in Comparative Example 2 in which 4 atomic percent of Ti was added only to the Nb core.

EXAMPLE 2

Alloy tubes were produced from Cu-7 atomic percent Sn-1 atomic percent Ti, and Cu-7 atomic percent Sn-1 atomic percent Hf produced in the same way as in Example 1. A Nb-base alloy core containing 2 atomic percent of Ti, Zr or Hf was inserted into each of the alloy tubes, and the composite was fabricated, and heat-treated in the same way as in Example 1. The $I_c$ values of the resulting products were measured, and the results are shown in Table 1.

A further improvement in $I_c$ characteristics was achieved because Ti, Zr or Hf was added to both the core and the matrix.

EXAMPLE 3

The same composites as in Example 1 were each fabricated into a round wire having an outside diameter of 0.5 mm, and then the surface of the wire was coated with Sn in a thickness of 10 μm by electro-plating. For the diffusion of Sn into the matrix, the coated wire was pre-heated at 450° C. for 10 hours, and then heat-treated at 750° C. for 50 hours. The $I_c$ values of the products are shown in Table 1.

It is seen that with samples obtained by adding Ti, Zr, or Hf to the matrix, the formation of a Nb₃Sn diffused layer was promoted by the coating of Sn.

TABLE 1

| | | Composition of the sample (atomic percent) | | | | | | Critical current $I_c$ (A) (4.2 K, 15 T) | Tensile Strength (kg/mm²) | |
|---|---|---|---|---|---|---|---|---|---|---|
| | | Element added to Nb | | | Element added to Cu-7% Sn alloy | | | | After aging heat-treatment | Before aging heat-treatment |
| | | Ti | Zr | Hf | Ti | Zr | Hf | | | |
| Example 1 | a | — | — | — | 1 | — | — | 15 | 51 | 37 |
| | b | — | — | — | — | 0.5 | — | 10 | 53 | 38 |
| | c | — | — | — | — | — | 1 | 16 | 57 | 39 |
| | d | — | — | — | 1 | — | 0.5 | 20 | 59 | 40 |
| Comparative Example 1 | | — | — | — | — | — | — | 4 | 37 | 35 |
| Comparative Example 2 | | 4 | — | — | — | — | — | 12 | 39 | 38 |
| Example 2 | a | 2 | — | — | 1 | — | — | 22 | | |
| | b | 2 | — | — | — | — | 1 | 23 | | |
| | c | — | 2 | — | 1 | — | — | 15 | | |
| | d | — | — | 2 | 1 | — | — | 27 | | |
| Example 3 | a | — | — | — | 1 | — | — | 21 | | |
| | b | — | — | — | — | 0.5 | — | 15 | | |
| | c | — | — | — | — | — | 1 | 24 | | |
| | d | — | — | — | 1 | — | 0.5 | 27 | | |

What we claim is:

1. In a process for producing a Nb₃Sn superconductor which comprises drawing a composite composed of a core of niobium or a niobium alloy and at least one matrix of a copper-tin alloy and subjecting the drawn composite to reactive heat-treatment, thereby forming a layer of Nb₃Sn between the core and the matrix; the improvement wherein the copper-tin alloy contains 1 to 15 atomic percent of tin, and 0.1 to 8 atomic percent in total of at least one element selected from the group consisting of 0.1 to 8 atomic percent of titanium, 0.1 to 5 atomic percent of zirconium and 0.1 to 5 atomic percent of hafnium.

2. The process of claim 1 wherein the niobium alloy core contains 0.1 to 15 atomic percent of one of titanium, zirconium and hafnium.

3. The process of claim 1 or 2 wherein the reactive heat-treatment is carried out at a temperature of 600° to 900° C.

4. The process of claim 1 wherein the heat-treated product is further subjected to aging heat-treatment at a temperature of 200° to 600° C.

5. The process of any one of claim 1 wherein before the reactive heat-treatment, the surface of the composite is coated with 0.1 to 50 volume percent, based on the copper-tin alloy matrix, of tin.

6. The process of claims 1 wherein the copper-tin alloy matrix contains 5 to 8 atomic percent of tin.

7. The process of claim 1 wherein the total amount of said at least one element in the copper-tin alloy matrix is 0.2 to 2 atomic percent.

8. The process of claim 1 wherein the amount of titanium, zirconium or hafnium in the niobium alloy core is 0.5 to 5 atomic percent.

* * * * *

UNITED STATES PATENT AND TRADEMARK OFFICE
CERTIFICATE OF CORRECTION

PATENT NO. : 4,419,145
DATED : December 6, 1983
INVENTOR(S) : Kyoji Tachikawa, et al.

It is certified that error appears in the above-identified patent and that said Letters Patent is hereby corrected as shown below:

Cover page, left column, add
--Foreign Application Priority Data
August 4, 1981   Japan   121479/81--

Cover page, in the Abstract,
line 1, "at least one" should be --a--;
line 3, "a" (first occurrence) should be --at least one--.

Column 6, line 49, delete "any one of";
line 53, "claims" should be --claim--.

Signed and Sealed this

Seventeenth Day of April 1984

[SEAL]

Attest:

GERALD J. MOSSINGHOFF

Attesting Officer      Commissioner of Patents and Trademarks